(12) United States Patent
Maeda et al.

(10) Patent No.: US 9,385,333 B2
(45) Date of Patent: Jul. 5, 2016

(54) PROCESS FOR PRODUCING THIN FILM FIELD-EFFECT TRANSISTOR

(75) Inventors: Takahiko Maeda, Hino (JP); Haruo Kawakami, Miura (JP); Hisato Kato, Hachioji (JP); Nobuyuki Sekine, Hachioji (JP); Kyoko Kato, Zushi (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 339 days.

(21) Appl. No.: 11/991,379

(22) PCT Filed: Aug. 24, 2006

(86) PCT No.: PCT/JP2006/316559
§ 371 (c)(1),
(2), (4) Date: Apr. 18, 2008

(87) PCT Pub. No.: WO2007/077648
PCT Pub. Date: Jul. 12, 2007

(65) Prior Publication Data
US 2009/0039342 A1 Feb. 12, 2009

(30) Foreign Application Priority Data
Jan. 6, 2006 (JP) .................................. 2006-001185
Apr. 26, 2006 (JP) .................................. 2006-121771

(51) Int. Cl.
*H01L 51/05* (2006.01)
*H01L 51/10* (2006.01)
*H01L 51/00* (2006.01)

(52) U.S. Cl.
CPC .......... *H01L 51/0545* (2013.01); *H01L 51/105* (2013.01); *H01L 51/0052* (2013.01); *H01L 51/0055* (2013.01); *H01L 51/0074* (2013.01); *H01L 51/0094* (2013.01)

(58) Field of Classification Search
CPC .............. H01L 51/0545; H01L 51/105; H01L 51/0055; H01L 51/0074; H01L 51/0094
USPC ........................................................ 257/40
See application file for complete search history.

(56) References Cited

U.S. PATENT DOCUMENTS

| 6,806,124 B2 * | 10/2004 | Klauk et al. ................. 438/149 |
| 2004/0161873 A1 * | 8/2004 | Dimitrakopoulos et al. ... 438/99 |
| 2005/0056828 A1 * | 3/2005 | Wada et al. ..................... 257/40 |

(Continued)

FOREIGN PATENT DOCUMENTS

| EP | 1 519 418 A1 | 3/2005 |
| EP | 1 562 240 A2 | 8/2005 |
| JP | 2003-304014 | 10/2003 |

(Continued)

OTHER PUBLICATIONS

Mo Zhu, Kody Varahramyan, Performance improvement of organic thin film transistors by SiO2/pentacene interface modification using an electrostatically assembled PDDA monolayer, Solid-State Electronics, vol. 50, Issue 2, Feb. 2006, pp. 129133, ISSN 0038-1101, DOI: 10.1016/j.sse.2005.10.040.*

(Continued)

*Primary Examiner* — Mark Tornow
(74) *Attorney, Agent, or Firm* — Manabu Kanesaka (57) ABSTRACT

A process for producing a thin film field-effect transistor includes providing a gate electrode, a gate insulating film, and source and drain electrodes, treating entire surfaces of the source and drain electrodes with a mixture of sulfuric acid and hydrogen peroxide, and providing an organic electronic material layer containing an organic electronic material on the gate insulating film to be in electrical contact with the source and drain electrodes. A reaction product of the organic electronic material, sulfuric acid and hydrogen peroxide containing a sulfonated product of the organic electronic material is present only at an interface between the source electrode and the organic electronic material layer and an interface between the drain electrode and the organic electronic material layer to thereby increase the electroconductivity of the organic electronic material and reduce a charge injection barrier from the source electrode to the organic electronic material.

6 Claims, 4 Drawing Sheets

(56) References Cited

U.S. PATENT DOCUMENTS

2005/0211977 A1    9/2005    Hirai et al.
2006/0128083 A1*  6/2006    Park et al. ................ 438/197
2006/0289858 A1* 12/2006   Park et al. ................ 257/40

FOREIGN PATENT DOCUMENTS

| | | |
|---|---|---|
| JP | 2004-288836 | 10/2004 |
| JP | 2005-277202 | 10/2005 |
| JP | 2006-165584 | 6/2006 |
| JP | 2007-115986 | 5/2007 |

OTHER PUBLICATIONS

"Performance improvement of organic thin film transistors by SiO2/pentacene interface modification using an electrostatically assembled PDDA monolayer"; Mo Zhu, Kody Varahramyan; Solid State Electronics, Elsevier Science Publishiers, Barking, GB, vol. 50, No. 2, Dec. 27, 2005, pp. 129-133, XP025127583; ISSN: 0038-1101.
Handbook of Semiconductor Wafer Cleaning Technology, Science, Technology, and Applications, Edited by Werner Kern, Werner Kern Associates, East Windsor, New Jersey, Noyes Publicaitons, Westwood, New Jersey, U.S.A.

* cited by examiner

PROCESS FOR PRODUCING THIN FILM FIELD-EFFECT TRANSISTOR

TECHNICAL FIELD

The present invention relates to a process for producing a thin film field-effect transistor using an organic electronic material.

BACKGROUND ART

In recent years, flat displays for information equipment are remarkably spread. In a liquid crystal display among these, light from a backlight is switched by an optical shutter function of a liquid crystal, and color is provided by using a color filter. An organic EL display (or an organic LED display), on the other hand, emits light from each pixels (i.e., self-luminous), and thus not only has an advantage of a wide viewing angle, but also has such many other advantages in that the device can have a low-profile owing to the disuse of a backlight, the display can be formed on a flexible substrate, and the like. Accordingly, an organic EL display is expected as a next-generation display.

The driving mode of the display panels are roughly classified into two modes. The first driving mode is referred to as a passive matrix type (or a duty driving mode or a simple matrix mode). In this mode, plural stripe electrodes are combined as rows and columns in a matrix form, and pixels positioned at intersecting points of the row electrodes and the column electrodes are made luminescent with a driving signal applied to the row electrodes and the column electrodes. The signal for controlling luminescence is generally scanned on row-by-row in time series, and applied simultaneously to all the columns of one row. This is a mode, in which no active device is generally provided on the pixels, which are controlled to emit light only in a duty period of the every row within the scanning cycle of the rows.

The second driving mode is referred to as an active matrix type, in which each pixel has a switching device, and is made luminescent over the scanning cycle of the rows. For example, such a case is assumed in that the entire surface of a panel having 100 rows and 150 columns is made luminescent at a display brightness of 100 Cd/m². In this case, since the pixels in the active matrix type generally emit light continuously, it is sufficient that they are made luminescent at 100 Cd/m² provided that the area ratio of the pixels and various losses are not taken into consideration. However, in order that the same display brightness is to be obtained with the passive matrix type, the duty ratio for driving the pixels is 1/100, and the luminescent period is only the duty period (selected period), whereby the luminescent brightness within the luminescent period is necessarily 100 times, i.e., 10,000 Cd/m².

For increasing the luminescent brightness, the electric current applied to the luminescent device may be increased. However, it has been known that when the electric current is increased, for example, in an organic EL luminescent device, the luminescent efficiency is decreased. Upon comparing the active matrix type driving mode and the passive matrix type driving mode with the same display brightness, the consumed electric power is relatively larger in the passive matrix type due to the decrease in efficiency. Furthermore, upon increasing the electric current applied to an organic EL device, the materials are liable to be deteriorated due to heat or the like, which brings about a disadvantage of decreasing the service life of the display device. In the case where the maximum electric current is restricted from the standpoint of the efficiency and the service life, on the other hand, it is necessary to prolong the luminescent period for obtaining the same display brightness. However, since the duty ratio, which determines the luminescent period in the passive matrix type driving mode, is the inverse of the row number of the panel, the prolongation of the luminescent period leads to restriction in display capacity (driving line number). In view of these factors, it is necessary to use the active matrix type driving mode for realizing a panel with large area and high definition. For the ordinary active matrix driving, a mode using a thin film transistor as a switching device has been known.

In the active matrix type driving mode, which is suitable for large area and high definition, a thin film transistor (TFT) using polysilicon is most widely used as a switching device of pixel. However, there is such a problem, for example, that the process temperature for forming TFT using polysilicon is a high temperature of at least 250° C., and a flexible plastic substrate is difficult to use.

In order to avoid the various problems associated with the conventional display panels, the use of an organic thin film transistor device has been proposed.

For example, JP-A-2001-250680 (Patent Document 1) discloses that an organic thin film rectifying device is connected in series to an organic thin film luminescent part, and WO01/15233 (Patent Document 2) discloses that a pixel is controlled for driving with an organic thin film transistor. According to the disclosure of Patent Document 2, since the driving device is constituted by an organic material, the production process can be carried out at a low temperature, and thus a flexible plastic substrate can be used. Furthermore, inexpensive material and process can be selected for reducing the cost.

Patent Document 1: JP-A-2001-250680
Patent Document 2: International Publication 01/15233
Non-patent Document 1: T. Arai, Y. Fujisaki, T. Suzuki, et al., "Gate length dependency of characteristics of bottom contact type organic TFT on plastic substrate", Preprints of 52nd Annual Meeting of the Japan Society of Applied Physics (March of 2005), p. 1511, upper column
Non-patent Document 2: N. Yoneya, T. Kimura, Y. Hirai, et al., "Organic TFT-driving QQVGA liquid crystal display on plastic substrate", Preprints of 66th Annual Meeting of the Japan Society of Applied Physics (September of 2005), p. 1178, lower column However, the organic thin film transistor has the following problems.

As disclosed in Non-patent Document 1, good FET characteristics for mobility, on/off ratio and threshold value are obtained only with a device having a long channel length. Upon producing a device using an organic thin film transistor, however, it is necessary to develop a device having a short channel length for reducing the size of the device.

Non-patent Document 2 discloses a technique for improving the state of a semiconductor/insulating film interface by using a hydrophobic organic insulating film, but even in this case, the mobility is 0.18 cm²/Vs (channel length=5 μm), which is only improvement about three times.

In view of the aforementioned points, accordingly, an object of the invention is to provide a process for producing a thin film transistor capable of preventing the FET characteristics from being deteriorated with a device having a short channel length.

SUMMARY OF THE INVENTION

According to one aspect of the invention, a thin film field-effect transistor is provided with a gate electrode, a gate insulating film that is provided on the gate electrode. Further, a source electrode and a drain electrode are provided on the gate insulating film with a prescribed distance, and an organic electronic material layer containing an organic electronic material is provided on the gate insulating film and is in electrical contact with the source electrode and the drain electrode, with an acid, an acid derivative and/or a reaction product of an acid. The organic electronic material is present in at least a part of an interface between the source electrode and the organic electronic material layer and an interface between the drain electrode and the organic electronic material layer.

According to another aspect of the invention, a process for producing a thin film field-effect transistor is disclosed. The method comprises the steps of providing a gate electrode, providing a gate insulating film on the gate electrode. Further, a source electrode and a drain electrode are provided on the gate insulating film with a prescribed distance, and an organic electronic material layer containing an organic electronic material is provided on the gate insulating film and is in electrical contact with the source electrode and the drain electrode. The process includes a step of treating at least a part of surfaces of the source electrode and the drain electrode with an acid, after providing the source electrode and the drain electrode and before providing the organic electronic material layer.

Advantages of the Invention

According to the invention, which will be described in detail below, such a thin film field-effect transistor is provided that is prevented from suffering deterioration in FET characteristics even in the case where the channel length is short.

DETAILED DESCRIPTION OF PREFERRED EMBODIMENT

Embodiments of the invention will be described below with reference to the attached drawings. However, the invention is not limited to the embodiments described below.

Figure 1:
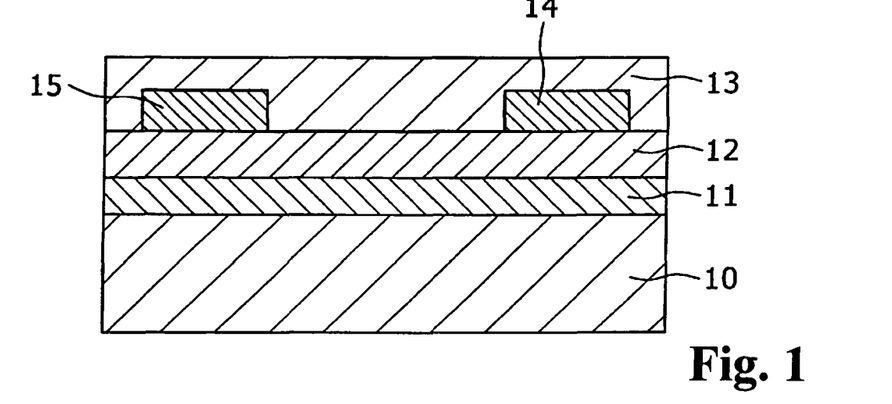
FIG. 1 The figure is a schematic cross sectional view of a thin film field-effect transistor according to the invention.

FIG. 1 shows a schematic cross sectional view of a thin film field-effect transistor according to the invention. The invention provides, according to one aspect, a thin film field-effect transistor that contains a gate electrode 11, a gate insulating film 12, a source electrode 15, a drain electrode 14 and an organic electronic material layer 13. The invention also provides, according to another aspect, a process for producing a thin film field-effect transistor that contains a gate electrode 11, a gate insulating film 12, a source electrode 15, a drain electrode 14 and an organic electronic material layer 13.

As having been described, the thin film field-effect transistor according to the invention has a gate electrode. Various kinds of metallic materials and organic electroconductive materials can be applied to the gate electrode. The material for the gate electrode may be determined in consideration of adhesiveness to the substrate, easiness in forming a gate insulating film, and the like. The material for the gate electrode is preferably, for example, tantalum. This is because tantalum can be easily provided with anodic oxidized film by an anodic oxidation treatment, and the resulting anodic oxidized film can be used as a gate insulating film. The thickness of the gate electrode may be, for example, 100 µm. The gate electrode can be formed, for example, by photoprocess and sputtering.

The thin film field-effect transistor according to the invention further has a gate insulating film. The gate insulating film is provided on the gate electrode. In the specification, "provided on" means being provided on the side where the gate insulating film is provided with respect to the gate electrode. Furthermore, providing the gate insulating film on the gate electrode means includes not only providing the gate insulating film directly on the gate electrode, but also cases where the gate insulating film is provided on the gate electrode through a certain member. The same is applied to the other members.

Various kinds of metallic oxides, such as oxides of silicon, aluminum, tantalum, titanium, strontium, barium and the like, an anodic oxidized film of the metals, or a mixed oxide of the oxides can be used as the gate insulating film. A polymer material, such as polystyrene, polyvinyl alcohol, polyvinylphenol, acrylate and the like, can also be used as the gate insulating film. A metallic oxide often has a high dielectric constant as compared to a polymer material, and has such characteristics that a transistor can be driven at a relatively low voltage. A polymer material, on the other hand, has a relatively low dielectric constant, and has such characteristics that good quick responsiveness is obtained. The thickness of the gate insulating film can be 500 nm, for example. The gate insulating film can be formed, for example, by subjecting tantalum formed as the gate electrode to an anodic oxidation treatment.

The thin film field-effect transistor according to the invention further has a source electrode and a drain electrode. The source electrode and the drain electrode are provided on the gate insulating film with a prescribed distance. The distance between the source electrode and the gate electrode (which may be referred to as a channel length or a gate length) is preferably from 1 to 50 µm, and more preferably from 1 to 5 µm. The width of the source electrode and the drain electrode (which may be referred to as a channel width or a gate width) is preferably from 1 to 5,000 µm, and more preferably from 10 to 1,000 µm.

Various kinds of metallic materials and organic electroconductive materials may be used as the source electrode and the drain electrode. In the case where the charge moving in the organic electronic material is a hole, for example, a material having a large work function, such as gold and the like, is often used as the material for the source electrode and the drain electrode for accelerating injection of a hole to the source electrode and suppressing injection of an electron to the drain electrode. In particular, the source electrode and the drain electrode preferably contain gold, platinum, palladium, silver, tungsten and/or titanium. Specifically, the source electrode and the drain electrode are preferably a metal, such as gold, platinum, palladium, silver, tungsten, titanium and the like, an alloy containing the metallic elements, electroconductive particles of the metals, or electroconductive particles of an alloy containing the metals. This is because the metals are excellent in acid resistance.

The thickness of the source electrode and the drain electrode may be, for example, 80 nm. The source electrode and the drain electrode can be produced, for example, in the following manner. A negative resist is spin-coated on the gate insulating film, heated under prescribed conditions, and exposed, and then it is developed to obtain a resist pattern. Thereafter, a metal for the electrode is vapor-deposited on the resist pattern, and an unnecessary part is removed by the liftoff method, whereby the source electrode and the drain electrode can be formed.

The thin film field-effect transistor according to the invention further has an organic electronic material layer. The organic electronic material layer is provided on the gate insulating film in electrical contact with the source electrode and the drain electrode.

The organic electronic material layer contains an organic electronic material. The organic electronic material is preferably such materials as pentacene, thiophene, a hexythiophene polymer, a fluorene-thiophene polymer, copper phthalocyanine, fullerene and the like, but is not limited thereto, and various organic electronic materials can be used. In particular, the organic electronic material is preferably an acene material represented by the following structural formula (I). The acene material can provide a transistor having high capability owing to the high charge mobility thereof, and particularly exhibits significant improvement in characteristics upon treating with a mixed liquid containing sulfuric acid and hydrogen peroxide.

[ka 1]

(I)

(wherein R represents an alkyl group having from 1 to 6 carbons, which may have a substituent, an aryl group, which may have a substituent, an alkoxy group having from 1 to 6 carbon atoms, which may have a substituent,

[ka 2]

or a residual group forming an aromatic ring or heterocyclic ring through condensation with an anthracene skeleton, and n represents an integer of from 0 to 10.)

More specifically, examples of the acene material include the compounds represented by the following structural formulae (I-1) to (I-26).

[ka 3]

(I-1)

(I-2)

(I-3)

(I-4)

(I-5)

(I-6)

(I-7)

(I-8)

(I-9)

(I-10)

(I-11)

(I-12)

(I-13)

(I-14)

(I-15)

The thickness of the organic electronic material layer may be, for example, 70 nm. The organic electronic material layer can be formed through film formation of the organic electronic material, for example, by vacuum deposition.

In the invention, an acid, an acid derivative and/or a reaction product of an acid and the organic electronic material is present at least a part of an interface between the source electrode and the organic electronic material layer and an interface between the drain electrode and the organic electronic material layer. The acid and the like may be present at least a part of the interface between the source electrode and the organic electronic material layer and the interface between the drain electrode and the organic electronic material layer, but may be present substantially the entire interfaces thereof.

It is considered that a thin film transistor having a short channel length has a decreased mobility because the source electrode and the drain electrode have a large contact resistance with respect to the organic electronic material layer as a semiconductor, and the ratio of voltage drop due to the contact resistance is increased with a smaller channel length, thereby decreasing the effective voltage contributing to electroconduction in the channel. Accordingly, for improving the mobility in a thin film transistor and for obtaining a high mobility with a short channel length, it is necessary to decrease the contact resistance between the source electrode and/or the drain electrode and the organic electronic material layer. As a result of various investigations by the inventors, it has been found that the mobility of the thin film transistor is significantly improved when an acid, an acid derivative and/or a reaction product of an acid and the organic electronic material is present at the interfaces between the source electrode and/or the drain electrode and the organic electronic material layer. As a result, furthermore, it has been found that the dependency of the mobility on the channel length is not found, and thus a mobility equivalent to the case of a long channel length can be obtained with a short channel length. It is considered that this is because of the following factors although technical scope of the invention is not restricted by the theory. That is, it is considered that the acid and the like functions as an acceptor of an electron (electron acceptor) to form a positive charge (hole), whereby the electroconductivity of the organic electronic material is increased, and the Fermi level of the organic electronic material is decreased, which reduce the charge injection barrier from the source electrode to the organic electronic material. It is considered consequently that the contact resistance between the source electrode and/or the drain electrode and the organic electronic material layer is significantly decreased, and the mobility of the thin film transistor is significantly improved.

Among the acid, the acid derivative and/or the reaction product of an acid and the organic electronic material present at the interfaces, the acid is preferably sulfuric acid or a reaction product of sulfuric acid and hydrogen peroxide. More specifically, the reaction product of sulfuric acid and hydrogen peroxide is preferably peroxomonosulfuric acid. The acid may also be a Lewis acid, such as $PF_5$, $BCl_3$, $SO_3$ and the like, a protonic acid, such as HCl, $HNO_3$, $HClSO_3$, $HCF_3SO_3$ and the like. The "acid" may be present at the interfaces in the form of an acid derivative (e.g., a form of ion, a form of salt and the like). Specifically, the acid derivative includes $SO^-$, $SO_2^-$, $SO_3^-$, $HSO_4^-$, $PF_6^-$, $ClO_4^-$, $NO_3^-$ and the like. The reaction product of an acid and the organic electronic material present at the interfaces preferably contains a sulfonated product of the organic electronic material.

The acid, the acid derivative and/or the reaction product of an acid and the organic electronic material can be provided by treating at least a part of surfaces of the source electrode and the drain electrode with an acid, after providing the source electrode and the drain electrode, before providing the organic electronic material layer. More specifically, the step of treating at least a part of surfaces of the source electrode and the drain electrode with an acid preferably contains a step of immersing at least a part of surfaces of the source electrode and the drain electrode into an acid, and a step of rising the acid-treated surfaces with pure water.

As the acid, an acid having a high viscosity is preferably used. Specifically, the viscosity of the acid is preferably from 2 to 90 centipoise, and more preferably from 10 to 90 centipoise. In the specification, the viscosity is that measured in the following manner. That is, the following measures have been known as the viscosity measuring method: a capillary viscometer (such as an Ostwald viscometer), in which a period of time while a certain volume of a fluid flows through a capillary is measured, and the viscosity is obtained with the Poiseuille's law; a falling-sphere viscometer, in which an infall velocity of a sphere in a quiescent fluid is measured; a bubble viscometer, in which a rising velocity of a bubble is measured; a rotation viscometer, in which a viscous resistance received by a rotation body is measured; a vibration viscometer, in which a viscous resistance received by an object vibrating in a fluid is measured; and the like, and what is referred in the specification is by a vibration viscometer.

More specifically, for example, the acid is preferably a mixed liquid containing sulfuric acid and hydrogen peroxide or a solution containing a reaction product thereof. It has been generally known that peroxomonosulfuric acid is formed through reaction of sulfuric acid and hydrogen peroxide. A mixed liquid containing sulfuric acid and hydrogen peroxide or a solution containing a reaction product thereof, for example, are preferred from the standpoint of reactivity with the organic electronic material and consistency with the process. The mixing ratio of sulfuric acid and hydrogen peroxide may be arbitrarily selected and is preferably such a range in that peroxomonosulfuric acid is formed. More specifically, the mixing ratio of sulfuric acid and hydrogen peroxide is preferably about from 15/1 to 27/1 in terms of weight ratio of pure substances. For example, in the case where sulfuric acid of 97% by weight and a hydrogen peroxide solution of 30% by weight are used, it is preferred that sulfuric acid is in a range of from 4 to 8 units by weight per 1 unit by weight of a hydrogen peroxide solution, or sulfuric acid is in a range of from 3 to 5 units by volume per 1 unit by volume of a hydrogen peroxide solution. Furthermore, the acid may be a Lewis acid, such as $PF_5$, $BCl_3$, $SO_3$ and the like, aprotonic acid, such as HCl, $HNO_3$, $HClSO_3$, $HCF_3SO_3$ and the like. The time for immersing into the acid may be, for example, 10 minutes.

Upon rinsing with pure water, it is preferred that ultrasonic cleaning is not carried out. Accordingly, acid ions can be appropriately attached to the metal surface. In other words, in the invention, the metal surface is not cleaned with the acid, but is treated with the acid remaining thereon. The time for rinsing with pure water may be, for example, 10 minutes.

The thin film field-effect transistor according to the invention preferably further has a substrate. As the substrate, various glass substrates and polymer films, such as polyimide, PEEK, PET and the like, may be used.

EXAMPLES

Examples of the invention will be described below with reference to the attached drawings. However, the invention is not limited to the examples described below.

Example 1

A gate electrode 11 made of tantalum was formed on a glass substrate 10 by ordinary photoprocess and sputtering. The thickness of the gate electrode was 100 nm.

An anodic oxidized film was then formed as a gate insulating film 12 on the gate electrode 11. The anodic oxidized film was formed by treating in a 1% by weight ammonium borate solution at 70 V for 2 hours. The thickness of the anodic oxidized film was 80 nm.

A negative resist was then spin-coated to a thickness of 4 μm and heated to 90° C. for 90 seconds, and after exposing at about 200 mJ, the resist was developed and further heated to 100 to 110° C. for 60 seconds to obtain a resist pattern. Gold was then vapor-deposited on the resist pattern to a thickness of 80 nm, and an unnecessary part was removed by the liftoff method, whereby a source electrode 15 and a drain electrode 14 were formed. The channel length was four conditions of 3, 5, 10 and 30 μm, and the channel width was 1,000 μm.

The assembly in this state was immersed in an acid solution for 10 minutes and then rinsed with pure water for 10 minutes, followed by drying at 200° C. for 30 minutes. Upon rinsing in pure water, ultrasonic cleaning was not carried out. As the acid solution, a mixture of sulfuric acid of 97% by weight and a hydrogen peroxide solution of 30% by weight at a ratio of 3/1 was used.

Finally, as an organic electronic material layer 13, pentacene (produced by Aldrich) was vacuum-deposited as a film. The temperature of the substrate at this time was room temperature. The thickness of the organic electronic material layer was 70 nm.

The formation of the films was carried out by using vapor deposition apparatus with diffusion pump evacuation. The vapor deposition was carried out at a vacuum degree of $4 \times 10^{-4}$ Pa ($3 \times 10^{-6}$ torr). Gold and pentacene were vapor-deposited by the resistance heating method at a film forming rates of 2 Å/sec and 0.4 Å/sec, respectively. The temperature of the substrate upon forming the films was room temperature.

Example 2

A sample of Example 2 was obtained in the same manner as in Example 1 except that the mixing ratio of sulfuric acid and the hydrogen peroxide solution was 4/1.

Comparative Example 1

A sample of Comparative Example 1 was obtained in the same manner as in Example 1 except that the acid treatment was not carried out.

[Evaluation]

Figure 2:
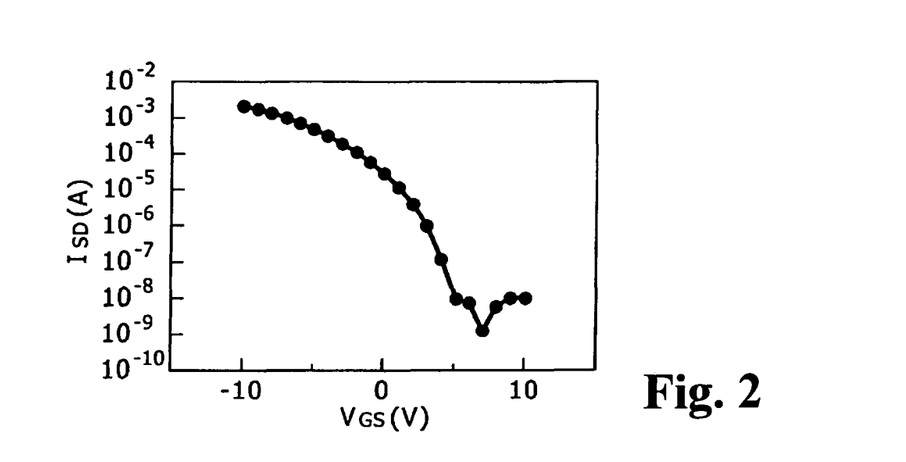
FIG. 2 The figure is a graph showing an example of electric characteristics of a thin film transistor obtained in Example 1 of the invention.
Figure 3:
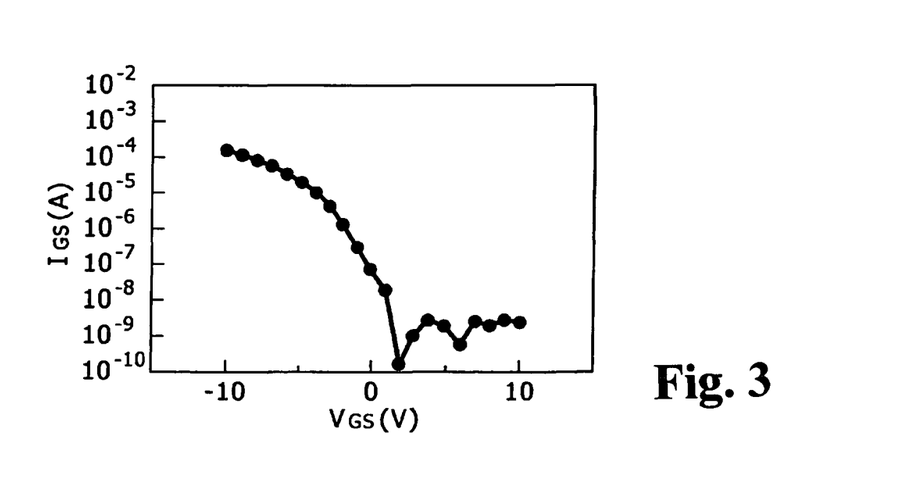
FIG. 3 The figure is a graph showing an example of electric characteristics of a thin film transistor obtained in Comparative Example 1 of the invention.

The thin film transistors of Examples and Comparative Example were confirmed to function as a p-channel type transistor. FIG. 2 shows the characteristics of the sample of Example 1 (channel length: 3 μm), and FIG. 3 shows the characteristics of the sample of Comparative Example 1 (channel length: 3 μm). Herein, $I_{SD}$ shows the source-drain current, and $V_{GS}$ shows the gate-source voltage. Table 1 shows the currents Isd of the samples (channel length: 3 μm) at Vg=−10 V. As comparing the characteristics of Examples 1 and 2 with Comparative Example 1, the source-drain current obtained with the same voltage application conditions is increased by 10 times or more. This shows that the electric resistance between the source and drain electrodes is decreased by the measure of the invention.

[Table 1]

TABLE 1

|  | Current value Isd (mA) |
| --- | --- |
| Example 1 | 1.960 |
| Example 2 | 1.405 |
| Comparative Example 1 | 0.119 |

Table 2 shows the mobilities of the samples obtained from the saturated currents. The mobility can be calculated as follows. That is, a source-drain current of a field-effect transistor in the saturation region is generally expressed by the following expression.

$$I_{SD} = A^* \mu^* (Vg - Vth)^2$$

Herein, A represents the constant depending on the shape of the transistor, μ represents the mobility, Vth represents the threshold value of the gate-source voltage, and $I_{SD}$ is obtained with Vg of Vth or less for a p-type device (Vg of Vth or more for a n-type device). Since $(I_{SD})^{0.5}$ and Vg are in linear relationship, accordingly, FIG. 2 is plotted again with $(I_{SD})^{0.5}$ for the ordinate to obtain the mobility μ as the gradient thereof. Since the expression ignores influence of the contact resistance between the source and drain electrodes and the semiconductor, however, the mobility obtained in this manner is an apparent value containing the influence.

[Table 2]

TABLE 2

|  | (cm$^2$/Vs) | | | |
| --- | --- | --- | --- | --- |
| Channel length | 3 μm | 5 μm | 10 μm | 30 μm |
| Example 1 | 0.71 | 0.72 | 0.72 | 0.73 |
| Example 2 | 0.77 | 0.78 | 0.78 | 0.78 |
| Comparative Example 1 | 0.113 | 0.19 | 0.22 | 0.28 |

Figure 4:
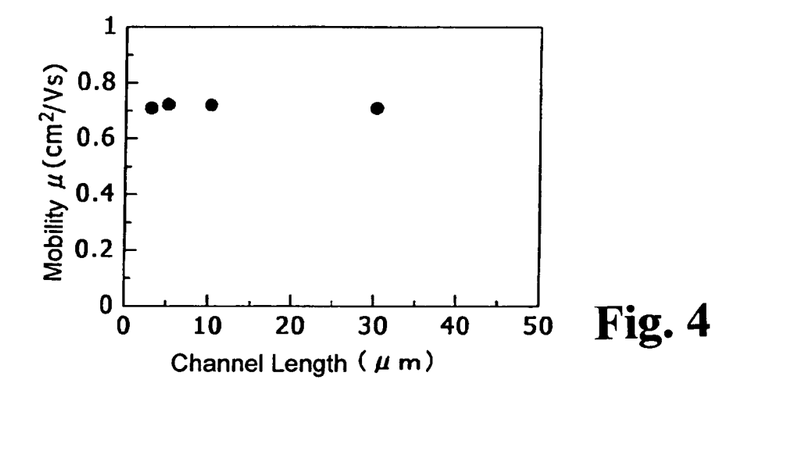
FIG. 4 The figure is a graph showing dependency of a mobility on a channel length of a thin film transistor obtained in Example 1 of the invention.
Figure 5:
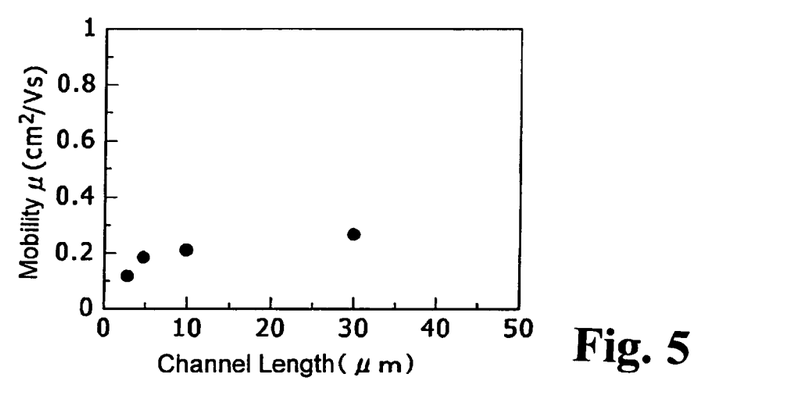
FIG. 5 The figure is a graph showing dependency of a mobility on a channel length of a thin film transistor obtained in Comparative Example 1 of the invention.

FIG. 4 shows dependency of the mobility on the channel length of the sample of Example 1, and FIG. 5 shows dependency of the mobility on the channel length of the sample of Comparative Example 1. The mobility is decreased with a smaller channel length in Comparative Example 1, whereas the mobilities in Examples 1 and 2 do not depend on the channel length, and the values thereof are larger than Comparative Example 1 by several times.

Figure 6:
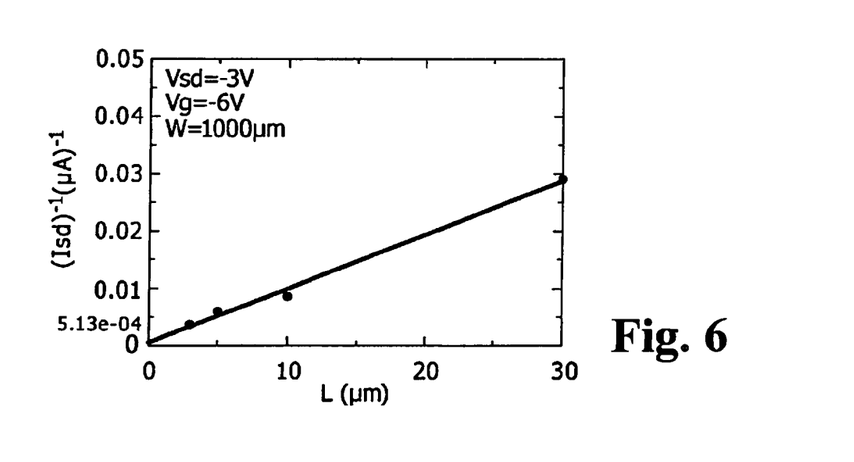
FIG. 6 The figure is a graph showing dependency of a drain current in a linear zone on a channel length of a thin film transistor obtained in Example 1 of the invention.
Figure 7:
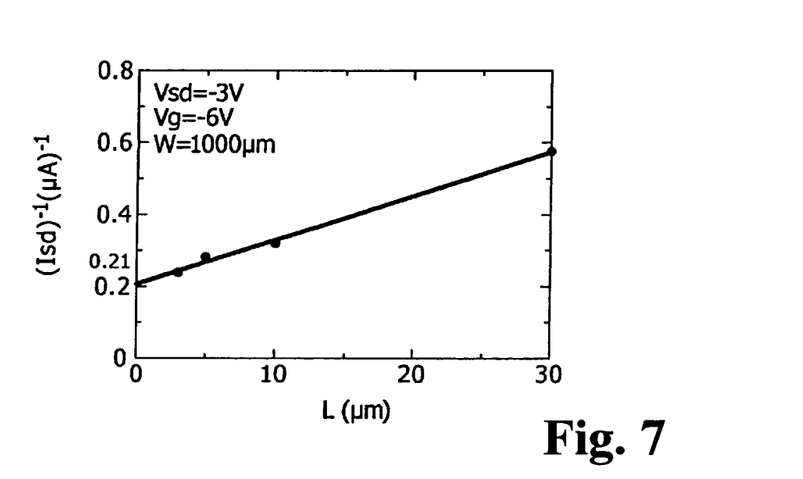
FIG. 7 The figure is a graph showing dependency of a drain current in a linear zone on a channel length of a thin film transistor obtained in Comparative Example 1 of the invention.

FIGS. 6 and 7 show graphs for obtaining the contact resistance between the source and drain electrodes and the organic electronic material in the samples. Herein, $I_{SD}$ represents the drain current, and the values in the region where the drain current-drain voltage characteristics are in linear relationship, specifically under conditions of $V_{SD}$ (source-drain voltage)=−3 V and $V_{GS}$=−6 V, were used. Under the conditions, the limit of the $(I_{SD})^{-1}$-L characteristics with the channel length L to 0 provides the contact resistance value. According to the manner, contact resistance values of 1.5 kΩ, 2.2 kΩ and 630 kΩ were obtained for Examples 1 and 2 and Comparative Example 1, respectively. It is understood that according to the invention, the contact resistance is decreased by two orders or more as compared to the conventional one. The advantage of the invention is recognized as improvement in mobility because the mobility considered herein is an apparent value containing the influence of the contact resistance between the source and drain electrodes and the semiconductor as having been described, and the increase of the current owing to the decrease of the contact resistance is expressed as the improvement in mobility.

Figure 8:
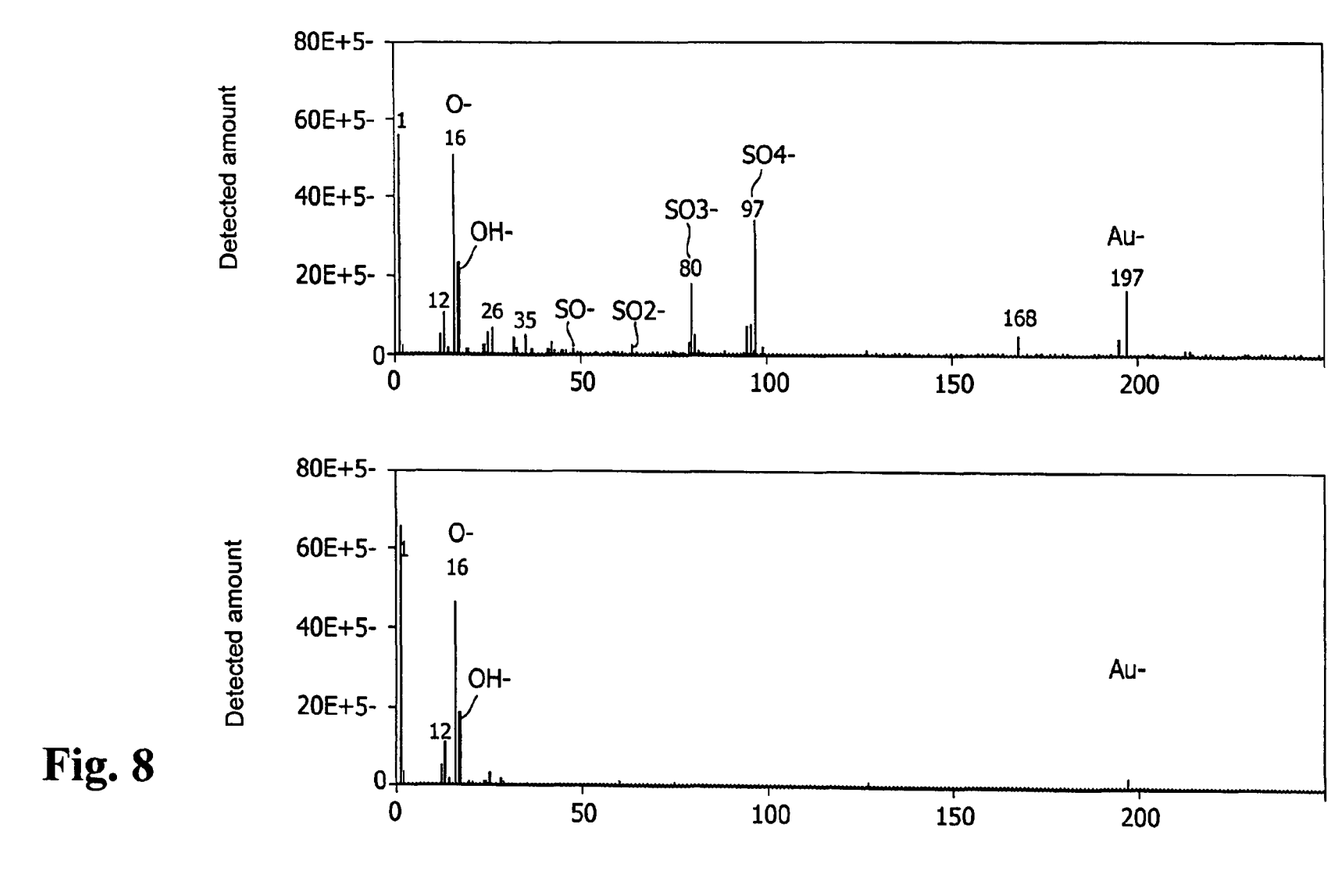
FIG. 8 The figures are graphs showing results of TOF-SIMS analysis on a source electrode of Example 1 and Comparative Example 1 of the invention. The upper figure shows Example 1 (rinsed with an acid), and the lower figure shows Comparative Example 1 (without rinsing).

FIG. 8 shows results of TOF-SIMS (time of flight-secondary ion micro-spectroscopy) analysis of a part on the gold electrode without pentacene vapor-deposited in the samples of Examples 1 and 2. As shown in FIG. 8, decomposition products ($SO^-$, $SO_2^-$, $SO_3^-$ and $HSO_4^-$) derived from the mixed liquid of sulfuric acid and a hydrogen peroxide solution were observed with TOF-SIMS. That is, it is expected that these are produced through decomposition of sulfuric acid ($H_2SO_4$) or peroxomonosulfuric acid ($H_2SO_5$) during the TOF-SIMS analysis. A slight amount of an Au—S compound is also observed while not shown in the figure. The same analysis is carried out for Comparative Example 1, but the products are naturally not observed. It has been well known that the acids sulfonate an organic material. The acids and the sulfonated product have tendency of negatively charging. According to these factors, it is expected that the acids and the sulfonated product function as an acceptor in the semiconductor.

According to the invention, in an organic thin film transistor, the contact resistance of the source electrode and the drain electrode with respect to the organic electronic material layer is significantly decreased, and the mobility of the thin film transistor can be significantly improved. The dependency of the mobility on the channel length is not found, and thus a mobility equivalent to the case of a large channel length can be obtained with a short channel length. As having been described, according to the invention, such a thin film field-effect transistor is provided that is not deteriorated in FET characteristics with a short channel length.

The invention claimed is:

1. A process for producing a thin film field-effect transistor comprising:
   providing a gate electrode,
   providing a gate insulating film on the gate electrode,
   providing a source electrode and a drain electrode on the gate insulating film with a prescribed distance,
   treating entire surfaces of the source electrode and the drain electrode with a mixture of sulfuric acid and hydrogen peroxide after providing the source electrode and the drain electrode and before providing an organic electronic material layer, and
   providing the organic electronic material layer containing an organic electronic material on the gate insulating film to be in electrical contact with the source electrode and the drain electrode,
   wherein a reaction product of the organic electronic material, sulfuric acid and hydrogen peroxide containing a sulfonated product of the organic electronic material is present only at an interface between the source electrode and the organic electronic material layer and an interface between the drain electrode and the organic electronic material layer to thereby increase the electroconductivity of the organic electronic material and reduce a charge injection barrier from the source electrode to the organic electronic material.

2. The process according to claim 1, wherein the reaction product of sulfuric acid and hydrogen peroxide is peroxomonosulfuric acid.

3. The process according to claim 1, wherein the organic electronic material is anthracene or an acene material represented by the following structural formula (I):

wherein R represents
an alkyl group having from 1 to 6 carbons,
an aryl group,
an alkoxy group having from 1 to 6 carbon atoms, or a residual group forming an aromatic ring or heterocyclic ring through condensation with an anthracene skeleton, and n represents an integer of from 1 to 10.

4. The process according to claim 1, wherein the source electrode and the drain electrode contain gold, platinum, palladium, silver, tungsten and/or titanium.

5. The process according to claim 1, wherein the reaction product of the organic electronic material, the sulfuric acid and hydrogen peroxide containing the sulfonated product of the organic electronic material directly contacts the interface between the source electrode and the organic electronic material layer, and the interface between the drain electrode and the organic electronic material layer to increase the electroconductivity of the organic electronic material, and to decrease Fermi level of the organic electronic material to reduce the charge injection barrier from the source electrode to the organic electronic material.

6. The process according to claim 5, wherein the sulfuric acid has a viscosity in a range of 10 to 90 centipoise.

* * * * *